(12) United States Patent
Behnen et al.

(10) Patent No.: US 7,080,335 B2
(45) Date of Patent: Jul. 18, 2006

(54) METHODS FOR MODELING LATCH TRANSPARENCY

(75) Inventors: Erwin Behnen, Holzgerlingen (DE);
Jeffrey P. Soreff, Pougkeepsie, NY (US); James D. Warnock, Somers, NY (US); Dieter Wendel, Schoenaich (DE)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/672,500

(22) Filed: Sep. 26, 2003

(65) Prior Publication Data
US 2005/0071790 A1   Mar. 31, 2005

(51) Int. Cl.
*G06F 17/50* (2006.01)

(52) U.S. Cl. .............................. 716/6; 716/1; 716/18
(58) Field of Classification Search ................ 716/1–2, 716/4–6, 18
See application file for complete search history.

(56) References Cited

U.S. PATENT DOCUMENTS 5,355,321 A * 10/1994 Grodstein et al. ............. 716/6

* cited by examiner

*Primary Examiner*—Paul Dinh
(74) *Attorney, Agent, or Firm*—Dugan & Dugan

(57) ABSTRACT

In a first aspect, a method is provided that includes the steps of (1) receiving a circuit design having a plurality of latches; and (2) allowing one or more latches of the circuit design to be locally treated as exhibiting latch transparency during modeling of the timing behavior of the circuit design. Numerous other aspects are provided.

15 Claims, 3 Drawing Sheets

METHODS FOR MODELING LATCH TRANSPARENCY

FIELD OF THE INVENTION

The present invention relates generally to integrated circuit (IC) design, and more specifically to methods for modeling latch transparency during IC design.

BACKGROUND

A circuit simulation tool may be used to determine a delay to logic transitions on one or more outputs of a proposed circuit design based on a delay from logic transitions on one or more inputs of the proposed circuit design. For example, a circuit simulation tool may determine a delay to logic transitions on one or more outputs of each component (e.g., logic device) included in the circuit design based on a delay from logic transitions on one or more inputs of the component. Thereby, the overall response of the circuit may be determined.

For complicated circuit designs, simulation of the exact behavior of each component within a circuit may be time consuming and in some cases prohibitive. Accordingly, static timing tools which model the timing behavior of a circuit and/or each component included in the circuit rather than the overall response of each circuit component have been developed. For example, static timing tools may be used to determine when one or more signals should be inputted by a portion of a circuit design, when one or more signals will be outputted from a portion of the circuit design, or other timing behavior of the circuit design.

An important aspect of successfully supporting circuit design using a static timing tool is accurately modeling the timing behavior of a latch, such as a master/slave latch. In many circuit designs, latches are used to divide logic included in a circuit design into paths of equal length which are bounded by the latches. Accordingly, any static timing model of such a circuit should accurately model the timing behavior of the latches employed by the circuit.

When implemented in hardware, latches included in high-performance applications generally exhibit latch transparency; a condition that allows a latch to operate properly even when data arrives at an input of the latch after a leading edge of a clock pulse that is used to launch data from the latch. Latch transparency may relax certain timing constraints of a circuit design, and should be modeled by a timing tool to provide a circuit designer greater flexibility. Unfortunately, latch transparency is not efficiently modeled using conventional timing tool techniques because such modeling is computationally expensive and a timing report created by the timing tool is difficult to interpret, for example, by a designer.

One conventional technique for modeling the behavior of a circuit in a timing tool treats each latch in the circuit as non-transparent. In a non-transparent latch (e.g., master/slave latch), data typically is captured by a first latch in the master/slave latch with a trailing edge of a capture clock signal, and is launched out of a second latch in the master/slave latch with a leading edge of a launch clock signal. Accordingly, when latch transparency is ignored, a timing tool must ensure that (1) data arrives at the first latch before a trailing edge of a capture clock signal which is used to capture data with the first latch; and (2) data arrives at the second latch before a leading edge of a launch clock signal which is used to launch data from the second latch. Although the above static timing model is easy to implement and does not require a static timing tool to perform a large amount of computation, such an approach places artificial timing constraints on a circuit design that may result in degraded circuit performance and that would not be present if latch transparency was considered. A non-optimal circuit design may result.

In another conventional technique for modeling the behavior of a circuit in a timing tool, every latch in the modeled circuit is treated as transparent. When every latch is treated as transparent, greater design flexibility is provided. However, a timing tool that treats all latches as transparent must determine the worst-case cycle time due to constraints imposed by all possible paths of a circuit design to ensure that signals reach their destinations as required by the circuit design. As such a large and in many cases unnecessary amount of computation is required to employ such a timing model.

Accordingly, additional methods for modeling latch transparency would be desirable.

SUMMARY OF THE INVENTION

In a first aspect of the invention, a first method is provided. The first method includes the steps of (1) receiving a circuit design having a plurality of latches; and (2) allowing one or more latches of the circuit design to be locally treated as exhibiting latch transparency during modeling of the timing behavior of the circuit design. That is, every latch of the circuit design need not be treated as transparent during modeling.

In a second aspect of the invention, a method for modeling latch transparency at a local level is provided that includes the steps of (1) determining a list of components and connections to the components included in an integrated circuit (IC); (2) identifying one or more local clock buffers (LCBs) in the IC; (3) identifying one or more clock signals of each LCB in the IC; (4) identifying one or more latches in the IC; and (5) identifying one or more latches coupled to each LCB in the IC. The method further includes the steps of associating a delay with a local clock coupled to one or more latches in the IC, and changing a timing model for the one or more latches and therefore, also the IC as a whole based on the delay.

Numerous other aspects are provided, as are computer program products in accordance with these and other aspects of the invention. Each computer program product described herein may be carried by a medium readable by a computer (e.g., a carrier wave signal, a floppy disc, a compact disc, a DVD, a hard drive, a random access memory, etc.).

Other features and aspects of the present invention will become more fully apparent from the following detailed description, the appended claims and the accompanying drawings.

DETAILED DESCRIPTION

In one or more embodiments of the present invention, a method is provided to locally account for transparency of a latch in a timing model of a circuit design. The timing model is provided to a static timing tool, which will determine the timing behavior of the circuit design by performing a timing run (e.g., a timing simulation) on the circuit design. In one embodiment, all latches coupled to a local clock buffer, which generates clock signals for the latches based on a global clock signal, are treated as transparent by the timing model. The ability to locally treat latches as transparent in a timing model avoids the disadvantages mentioned above of treating every latch in a circuit design as transparent. The above method also provides the advantage of not limiting the cycle time of a circuit design by the longest path of the circuit design.

Figure 1:
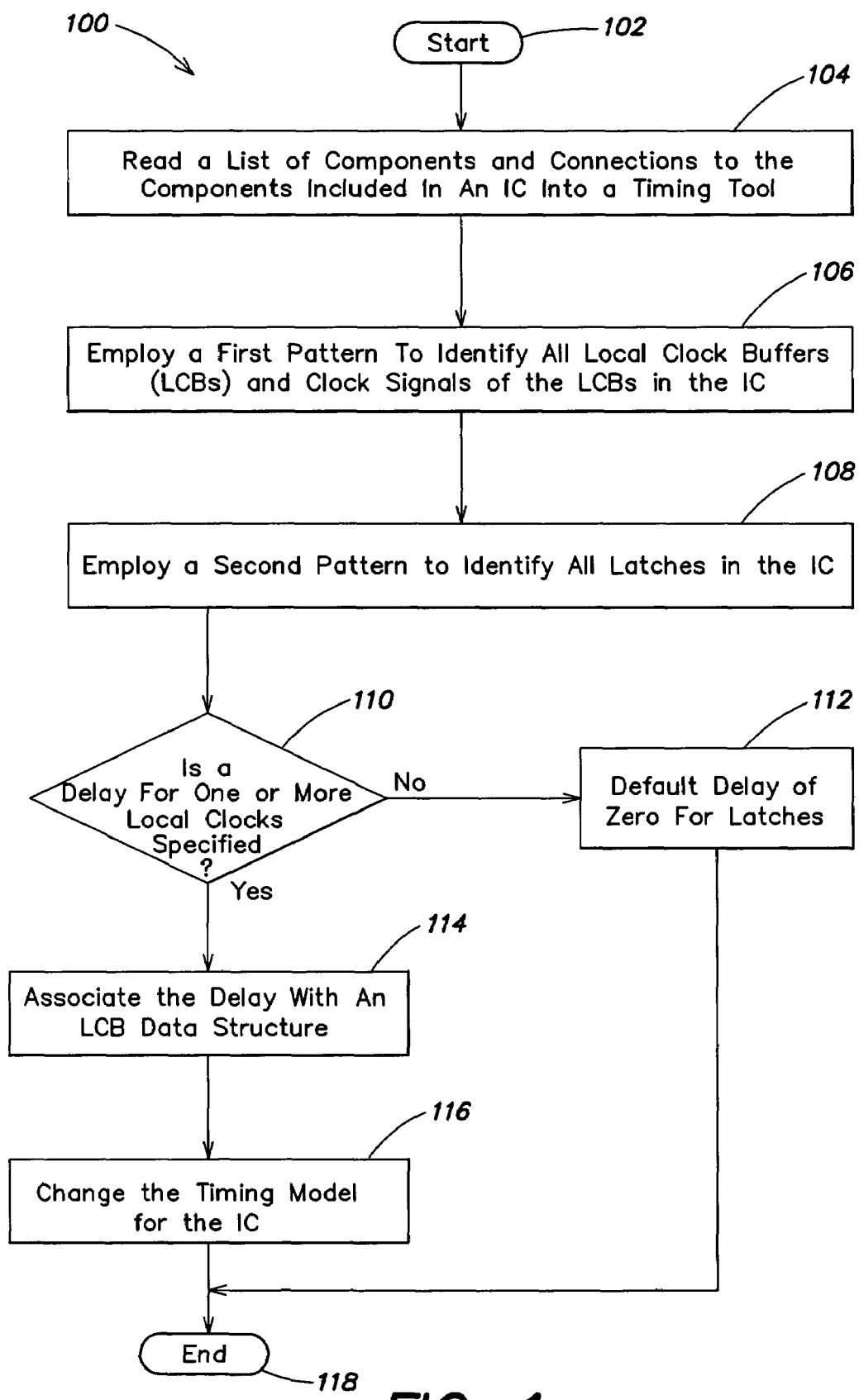
FIG. 1 illustrates an exemplary method for locally accounting for transparency of a latch in a timing model of a circuit design.

FIG. 1 illustrates an exemplary method 100 to locally account for transparency of a latch in a timing model of a circuit design. One or more of the steps of the method 100 may be implemented as computer program code and/or as one or more computer program products. With reference to FIG. 1, in step 102, the method 100 begins. In step 104, a list of components and connections to the components included in an integrated circuit (IC) are read into a static timing tool. For example, a netlist or similar component/connection listing may be read into the static timing tool, which is modified in accordance with the present invention. Static timing tools are conventional modeling tools that may determine the timing characteristics of an IC before the circuit design goes into production. In contrast to most conventional timing tools, the timing tool of the present invention may model circuit components (e.g., latches) at the transistor level as described further below.

Following step 104, step 106 is performed. In step 106, a first pattern is employed to identify one or more local clock buffers (LCBs) in the IC. The first pattern may include, for example, a sub-netlist or similar list of transistors used to create each LCB; and the first pattern may be compared to the netlist of the IC to identify the LCBs of the IC (e.g., by identifying the transistors that create each LCB).

The first pattern also may be employed to identify the names (e.g., net names) of clock signals (e.g., local clock signals) generated by one or more LCBs in the IC. Each LCB may generate a unique set of clock signals. In one particular embodiment, the net names of the clock signals generated by one or more LCBs are stored in a data structure, such as an associative array or hash. The name of the LCB which generates a clock signal may be used to index the data structure. In general, the first pattern may be used to identify all LCBs in the IC and the net names of all clock signals generated by the one or more LCBs (via the net names of the clock signals stored in a data structure).

The first pattern may be provided by a circuit designer, and/or may be stored in a file. In one or more embodiments, the static timing tool may include a control file that refers to the file storing the first pattern and that causes the timing tool to read in the first pattern. Likewise, a data structure including all LCBs may be created and stored by the timing tool. Other techniques for creating and/or storing the first pattern may be employed.

In step 108, a second pattern is employed to identify one or more latches in the IC. In general, the second pattern may be used to identify all latches in the IC. The second pattern may include, for example, a sub-netlist or similar list of the transistors used to create each latch; and the second pattern (e.g., the sub-netlist) may be compared to the netlist of the IC to identify the latches of the IC (e.g., by identifying the transistors used to create each latch). Thereafter, the net names of the clock signals input to the latches identified above may be identified and provided to (e.g., used to index) a data structure which stores the net names of all the clock signals (step 106) so as to identify one or more latches coupled to each LCB. As with the first pattern, the second pattern may be provided by a circuit designer, and/or stored in a file. In one embodiment, the static timing tool may include a control file that refers to the file storing the second pattern and that causes the timing tool to read in the second pattern. Likewise, a data structure including all latches may be created and stored by the static timing tool.

After all the latches in the IC are identified using pattern matching (steps 106 and 108), the latches are marked as non-transparent by the timing tool (and will be treated as non-transparent by the timing tool unless modified as described below). For example, when a latch is treated as non-transparent by the timing tool, the timing tool will perform a setup check for data input by the latch. The setup check may determine whether data arrives early enough to be stable at the input of the latch (so that the data may be captured by the latch successfully). If so, the timing tool may launch the data out of the latch with the leading edge of a launch clock pulse (as described further below).

In step 110, it is determined whether a delay value for one or more local clocks is specified. For example, a user, such as a system designer, may create a delay file which includes the name of one or more local clocks (identified above in step 106) and a delay value for each local clock. A delay value for a local clock indicates the amount of time by which a rising (e.g., leading) edge of a launch clock signal input to a latch associated with the local clock is to be delayed. Delaying the rising (e.g., leading) edge of the launch clock signal input to a latch during circuit timing modeling allows the timing tool to effectively model circumstances, which occur during operation of a circuit, in which data arrives at the latch after the rising edge of the launch clock but is nevertheless launched out of the latch (e.g., due to latch transparency), without the modeling resulting in an error condition. That is, because the launch clock signal input to the latch (e.g., the slave latch in a master/slave latch) during the timing modeling is delayed, the timing tool treats the data that would otherwise arrive at the latch after the rising edge of the launch clock signal as if it arrives at the latch prior to the rising edge of the launch clock signal. Therefore, the timing tool does not generate an error condition. In one or more embodiments, after all LCBs and latches have been identified (steps 106 and 108) a control file included in the timing tool may read in the delay file created by the user. If it is determined that a delay value is not specified for any local clocks (e.g., if no delay file exists), step 112 is performed.

In step 112, the timing tool creates a delay file specifying the local clocks of the IC and a default delay value of zero for each local clock. In one embodiment, the delay file created by the timing tool may also include the latch names which receive clock signals from a specified local clock. The above delay file created by the timing tool may be modified later by a user, such as a system designer. For example, the user may change the delay value associated with one or more local clocks in the delay file prior to a subsequent timing run. The user may add entries to the delay file indicating a local clock and a delay value corresponding to the local clock and/or remove entries from the delay file. Therefore, a circuit designer may perform an initial timing run on an integrated circuit without including any delay values for local clocks (e.g., with all latches being treated as non-transparent). Thereafter, during subsequent timing runs, the designer may easily add transparency to latches at a local level by specifying a delay value for the local clock that is coupled to the latches (e.g., through the use of the delay file created by the timing tool). Following step 112, the process 100 ends (step 118).

If it is determined that a delay value for one or more local clocks is specified in step 110, step 114 is performed. In step 114, the delay value specified for each local clock is associated with a data structure (e.g., an LCB or local clock data structure). More specifically, for each local clock the timing tool associates the specified delay value with all latches connected to the local clock. Thereafter, a new delay file may be created that includes all local clocks currently in the circuit design and any delay value specified for the local clocks. For example, if a delay file already exists, the data within the delay file may be updated or overwritten with the newly-added delay value(s). Likewise, an entirely new delay file may be created. Entries in an original delay file specifying a delay value corresponding to local clocks that are no longer in the circuit design will not be included in the new delay file. An entry will be included in the new delay file for local clocks added to the current circuit design (e.g., after a prior timing run). The delay file will include a default delay value of zero for each of these newly added local clocks. Thereafter, the new delay file created by the timing tool may be modified by a user to adjust the delay associated with one or more local clocks (e.g., and all latches connected to the local clocks) in the circuit design prior to a subsequent timing run.

In step 116, the timing model for the IC is changed. More specifically, the timing model of one or more latches in the IC is changed based on the delay value(s) specified in step 110. In this manner, the overall timing model of the IC (e.g., a timing abstract) is changed based on the changes made to the timing model of the latches.

In one or more embodiments, the timing tool may create a file (e.g., a latch timing modification file) that includes commands to change the timing model of each latch corresponding or connected to a local clock for which a delay value is specified in the delay file (described below). Various design checks may be performed by the timing tool. For example, the timing tool may determine whether the delay value for a local clock specified in the delay file is positive. If the specified delay value is negative, the timing tool will not change the timing model for the latch corresponding or connected to the local clock, and will issue an error message. Likewise, the timing tool may determine whether the delay value for a local clock specified in the delay file is larger than a predetermined (maximum) value. If the specified delay value for a local clock is larger that the predetermined value, the latches coupled to the local clock may not function properly (e.g., the latches may not capture and launch data properly). Therefore, the timing tool may choose not to change the timing model for the latches, and issue an error message. However, if the specified delay value is positive and not larger than the predetermined value, a latch timing modification file may be created to change the timing models of the latches coupled to a local clock specified in the delay file so that the transparency of latches coupled to the specified local clocks is accounted for during the timing modeling. In one embodiment, the predetermined value may be set to half of a cycle time of a chip including the latches. The predetermined value may be set to other values.

For each local clock included in the delay file, the latch timing modification file includes a first command for changing the setup time for the latch during the timing run, a second command for increasing the data delay through the latch coupled to the local clock (e.g., by treating data as being launched out of the latch at a later time during the timing run), and a third command for reducing the clock pulsewidth that must be seen by the latch coupled to the local clock during the timing run.

Under normal circumstances, when the timing tool performs a timing run on an IC to determine the timing behavior of the IC, the timing tool may calculate a setup time for each latch to be used during the timing run. The setup time determines the latest time that data may arrive at the input of the latch and be ensured that it is captured accurately by the latch. The timing tool may also calculate a time when data is launched from a latch during the timing run. When data is launched from a latch the data is made available to logic that follows the latch.

The timing tool may also calculate a minimum pulsewidth of the clock signal (e.g., launch clock signal) that must be provided to the latch to ensure proper functioning (e.g., capturing and launching of data) of the latch during the timing run.

The first command is used to relax the setup check performed by a latch by allowing data to arrive at the latch at a later time than originally calculated by the timing tool. In this manner, a longer data path may be defined by the user and used to input data to the latch so that data may arrive at the latch at a later time and nonetheless be captured by the latch during the modeling. The second command delays the launching of data from the latch by the same amount that the setup check is delayed by the first command in the timing run. Therefore, data arrives at logic that follows the latch at a later time as specified by the delay. The third command is used to ensure correct functioning of the latch. The timing tool determines whether the clock pulse input to the latch is active long enough (e.g., whether the clock pulsewidth is greater than or equal to a minimum size) to accurately capture data into the latch. By reducing the minimum clock pulsewidth required for the latch, the above pulsewidth check is tightened during the modeling. More specifically, reducing the clock pulsewidth ensures that the data will appear to arrive early enough at the latch to be written correctly during the modeling. The reduced pulsewidth check protects in the timing environment against a specified delay value which would correspond to a real setup time violation in the physical world.

In summary, the commands in the latch timing modification file, when executed, allow the timing tool to locally account for transparency of latches in a timing model of an IC. The timing tool uses the latch timing modification file to update the timing model of each latch coupled to a local clock for which a delay value is specified in the delay file; and uses the updated timing model for each latch coupled to the local clock specified in the delay file during a timing run for the IC to create an updated overall timing model (e.g., a timing abstract) for the IC. The timing modifications made locally to the timing models of the latches to account for transparency are incorporated within the new timing abstract and will not be visible in subsequent timing runs for circuit designs that include the IC as a component. In step 118, the method 100 of FIG. 1 ends.

Figure 2:
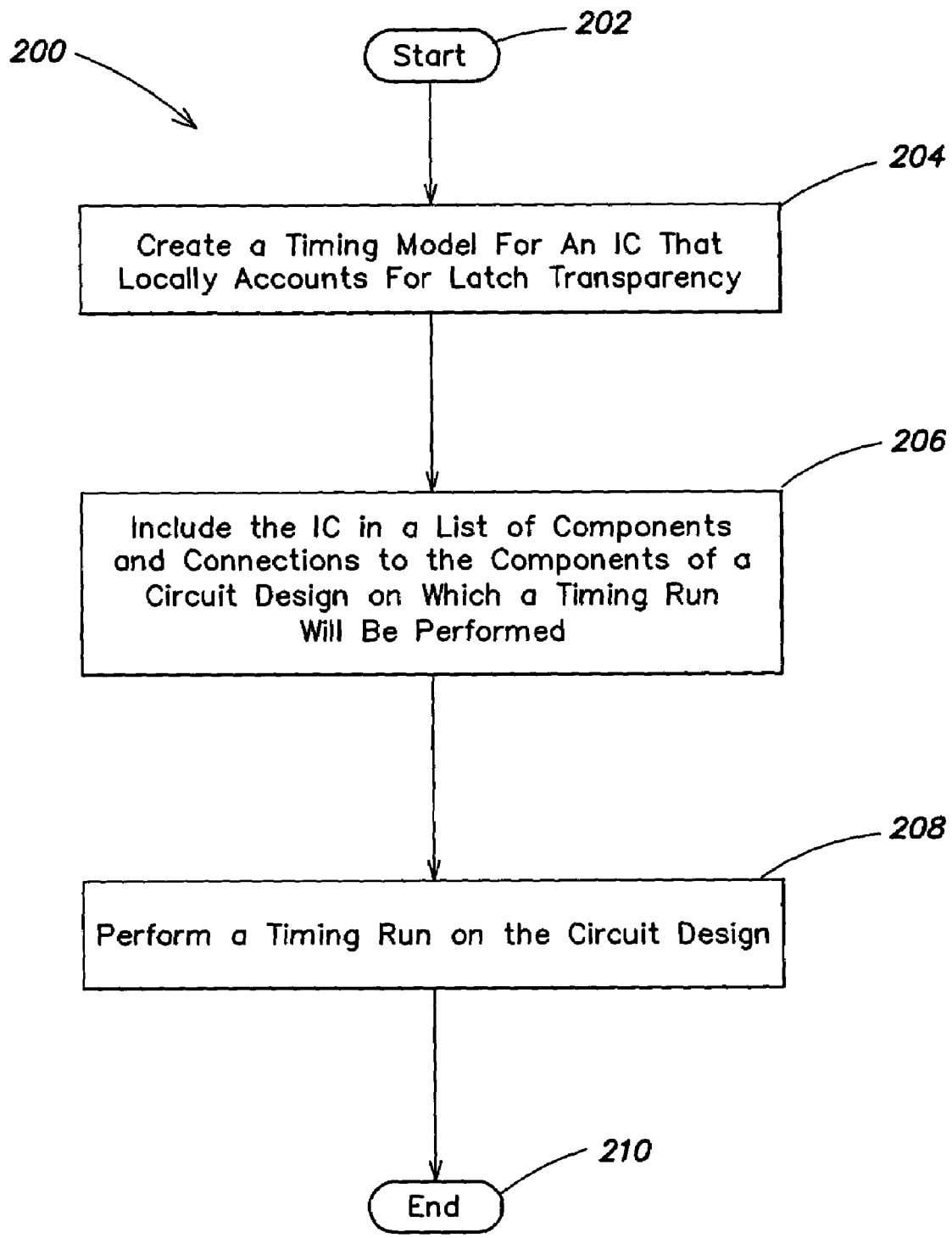
FIG. 2 illustrates an exemplary method of performing a timing run on a circuit design that locally accounts for transparency of one or more latches in accordance with the present invention.

FIG. 2 illustrates an exemplary method 200 of performing a timing run on a circuit design that locally accounts for transparency of one or more latches in accordance with the present invention. The method 200 of FIG. 2 may be implemented in software operable on one or more processors and/or as one or more computer program products.

With reference to FIG. 2, in step 202, the method 200 begins. In step 204, a timing model for an IC is created that locally accounts for latch transparency. For example, the timing model may be created as described previously with reference to the method 100 of FIG. 1.

In step 206, the IC is included in a list of components and connections to the components of a circuit design on which a timing run is to be performed. The IC may then be treated as one component with one or more input connections and one or more output connections included in the list of components and connections to the components (e.g., a netlist) of the circuit design. The netlist may include other IC components for which a timing model (e.g., a timing abstract) was created in a prior timing run. For example, the method 100 of FIG. 1 may be used to create the timing model for one or more of these IC components. At such a chip or unit level each component included in the circuit design may represent a separate IC, and a timing abstract may be provided to the timing tool for each IC component included in the circuit design on which a timing run is performed. As stated, a timing abstract describes when signals must be received at the input of a component and when signals must arrive at the output of the component (e.g., based on a delay to logic transitions on one or more outputs of the component caused by a delay to logic transitions on one or more inputs of the component).

It should be noted that any number of components that account for latch transparency may be included in a circuit design. However, on the chip level, the timing adjustments necessary to account for latch transparency within a component are not apparent, but rather are incorporated into the timing abstract of that component (as described with reference to FIG. 1).

In step 208, a timing run is performed on the circuit design. More specifically, a chip level timing run is performed on the circuit design. Using the timing abstract of each of the components (e.g., ICs) included in the circuit design, the timing tool determines the timing behavior of the overall circuit design. The timing behavior of the overall circuit design will describe when signals must arrive at the input of the circuit design and when signals must arrive at output of the circuit design (e.g., based on a delay to logic transitions on one or more outputs of the circuit design caused by a delay to logic transitions on one or more inputs of the circuit design). Note that the timing tool does not directly account for latch transparency during the chip level (e.g., global) timing run. As mentioned above, latch transparency for an IC component is accounted for during a previous timing run for the IC component during which a timing abstract for the IC component is created. Therefore, the timing tool does not need to directly account for latch transparency during the global timing run. In step 210, the method 200 of FIG. 2 ends.

Through use of the method of FIG. 2, latch transparency may be employed at a local level. More specifically, by performing a global timing run on a circuit design that does not directly account for latch transparency but which includes components (e.g., ICs) that account for latch transparency, latch transparency may be applied locally (avoiding the disadvantages of applying latch transparency globally).

Figure 3:
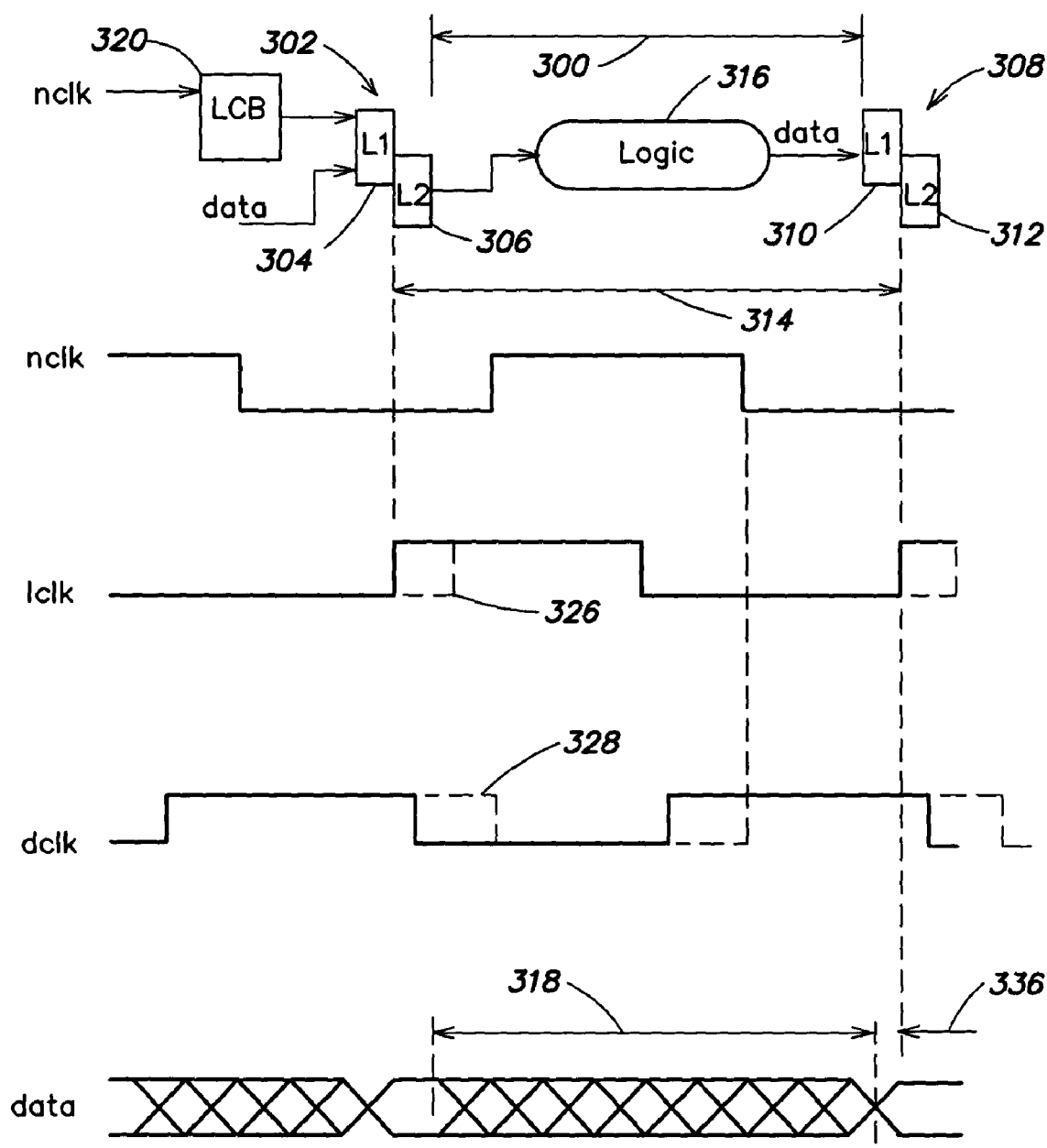
FIG. 3 illustrates exemplary timing adjustments made to an LCB in accordance with the present invention.

FIG. 3 illustrates exemplary timing adjustments made to one or more latches in accordance with the present invention. As shown in FIG. 3, a data path 300 included in an IC may be bounded by a first set of latches 302 (e.g., an L1 latch 304 and an L2 latch 306) and a second set of latches 308 (e.g., an L1 latch 310 and an L2 latch 312). Data may propagate along the data path 300 as required by the cycle time 314 of the IC. The data path 300 may include logic 316 which may introduce a logic delay 318 in the data path 300.

The L1 latch 304 of the first set of latches 302 receives an input data signal (e.g., data), and receives input clock signals (from an LCB 320). As mentioned above, the LCB 320 generates clock signals (e.g., dclk for L1 and lclk for L2) based on a global clock signal (e.g., nclk) of the IC. A setup check determines whether data arrives early enough at the input of the L1 latch 304 to ensure its stability and capture prior to a change in clock state. A hold check determines whether data has been stable on the input of the L1 latch 304 long enough after the clock pulse has changed state.

As shown in FIG. 3, the present methods 100, 200 may be used to introduce a delay to (e.g., adjust the timing of) the launch clock signal lclk input to the L2 latches 306, 312. Specifically, a delay 326 is introduced to the leading edge of lclk during the modeling. Because a delay 328 is added to the path of the data clock signal dclk (e.g., via a pair of inverters) in the hardware, dclk and lclk coupled to a latch (e.g., master/slave latch) may be overlapping during operation of the latch and therefore, the latch is treated as transparent. By delaying the leading edge of the lclk during modeling, the lclk and dclk may no longer overlap such that the latch is treated as non-transparent in the model.

By delaying the leading edge of the launch clock signal lclk input to the L2 latch 306, data will be launched out of the L2 latch 306 at a later time. Such a delay allows the timing tool to model a circuit in which data actually arrives at a latch after the rising edge of the launch clock but is nonetheless launched out of the latch (e.g., due to latch transparency) without the modeling resulting in an error condition.

By shifting (e.g., delaying) only the leading edge of the launch clock signal lclk, the launch clock pulsewidth seen by the L2 latch 306 is reduced. Therefore, to avoid an error condition, the minimum clock pulsewidth (e.g., launch clock pulsewidth) that must be seen by the L2 latch 306 to ensure proper functioning of the latch is reduced during the timing modeling.

A setup check 336 may be performed on data input to the L2 latch 312 to the leading edge of the launch clock signal lclk. Setup checks are known in the art and are not described further herein.

Hence, by adjusting (e.g., delaying) the launch clock lclk signal input to a set of latches (e.g., master/slave latches 302, 308), the methods 100, 200 of FIGS. 1 and 2 may be performed.

The foregoing description discloses only exemplary embodiments of the invention. Modifications of the above-disclosed methods which fall within the scope of the invention will be readily apparent to those of ordinary skill in the art. For instance, while in the present invention timing adjustments to account for the transparency of latches in a timing model are implemented on a local clock basis (e.g., a timing adjustment is specified for a local clock, and therefore, all latches associated with the local clock receive the same timing adjustment), in other embodiments, timing adjustments may be specified for one or more latches directly.

Further, while the present methods disclose calculating a new timing model for one or more latches based on a file including timing delays specified by a user, in other embodiments, the timing tool may be used to automatically calculate the maximum delay or timing adjustment that may be applied to a local clock coupled to one or more latches. Further, although the present methods may be used for modeling the timing behavior of a master/slave latch, in other embodiments, the present methods may be used for modeling the timing behavior of other types of latches, such as a pulsed clock latch.

Although in one or more embodiments, positive-active latches are used, in other embodiments, negative-active latches may be used. In such embodiments, the signal diagram includes the same leading and trailing transitions as the signal diagram used for positive-active latches, but with opposite signs on the transitions (e.g., a leading transition is a falling edge of a clock pulse and a trailing transition is a rising edge of the clock pulse. Further, the present invention applies if the L1 and L2 latches switch roles (e.g., if the L1 latches, rather than the L2 latches, are described as having setup tests performed against the leading edges of their respective clocks).

Accordingly, while the present invention has been disclosed in connection with exemplary embodiments thereof, it should be understood that other embodiments may fall within the spirit and scope of the invention as defined by the following claims.

The invention claimed is:

1. A method for modeling a circuit having one or more latches comprising:
   providing a timing tool that models a circuit design having latches, wherein the timing tool models each latch of the circuit design as being non-transparent;
   receiving the circuit design in the timing tool, the circuit design having a plurality of latches; and
   allowing a selected subset of one or more latches of the circuit design to exhibit latch transparency while the selected subset is still being modeled as non-transparent by the timing tool during modeling of a timing behavior of the circuit design with the timing tool.

2. The method of claim 1 wherein receiving the circuit design having a plurality of latches comprises receiving a list of components and connections to the components included in an integrated circuit (IC).

3. The method of claim 1 wherein allowing a selected subset of one or more latches of the circuit design to exhibit latch transparency includes altering an input signal to the selected subset of one or more latches.

4. The method of claim 3 wherein altering an input signal to the selected subset of one or more latches includes preventing the input signal from reaching the selected subset of one or more latches at a time that the input signal would have otherwise reached the selected subset of one or more latches.

5. The method of claim 4 wherein the input signal includes a launch clock signal.

6. A computer program product for modeling a circuit having one or more latches comprising:
   a medium readable by a computer, the computer readable medium having computer program code adapted to:
   model a circuit design having latches, wherein each latch of the circuit design is modeled as being non-transparent;
   receive the circuit design having a plurality of latches; and
   allow a selected subset of one or more latches of the circuit design to exhibit latch transparency while the selected subset is still being modeled as non-transparent during modeling of a timing behavior of the circuit design.

7. The computer program product of claim 6 wherein the computer program code adapted to receive a circuit design having a plurality of latches includes computer program code adapted to receive a list of components and connections to the components included in an integrated circuit (IC).

8. The computer program product of claim 6 wherein the computer program code adapted to allow a selected subset of one or more latches of the circuit design to exhibit latch transparency includes computer program code adapted to alter an input signal to the selected subset of one or more latches.

9. The computer program product of claim 8 wherein the computer program code adapted to alter an input signal includes computer program code adapted to prevent the input signal from reaching the selected subset of one or more latches at a time that the input signal would have otherwise reached the selected subset of one or more latches.

10. The computer program product of claim 8 wherein the input signal includes a launch clock signal.

11. A method for modeling a circuit having one or more latches comprising:
    providing a timing tool adapted to model circuit designs, wherein the timing tool models latches in the circuit designs as non-transparent;
    receiving a circuit design in the timing tool, the circuit design having a plurality of latches;
    selecting a subset of the plurality of latches of the circuit design; and
    altering a signal input to the subset of latches so that the subset of latches exhibit latch transparency during modeling of a timing behavior of the circuit design even though the timing tool continues to model the subset of latches as non-transparent.

12. The method of claim 11 wherein receiving the circuit design in the timing tool includes receiving a list of components and connections to the components included in an integrated circuit (IC).

13. The method of claim 11 wherein altering a signal input to the subset of latches includes altering an input signal to a clock input of the selected subset of one or more latches.

14. The method of claim 13 wherein altering an input signal includes preventing the input signal from reaching the selected subset of latches at a time that the input signal would have otherwise reached the selected subset of latches.

15. The method of claim 14 wherein the input signal includes a launch clock signal.

* * * * *